US006959028B2

(12) United States Patent
Jones

(10) Patent No.: US 6,959,028 B2
(45) Date of Patent: Oct. 25, 2005

(54) EXTERNAL CAVITY, WIDELY TUNABLE LASERS AND METHODS OF TUNING THE SAME

(75) Inventor: Richard Jones, Santa Clara, CA (US)

(73) Assignee: Intel Corporation, Santa Clara, CA (US)

(*) Notice: Subject to any disclaimer, the term of this patent is extended or adjusted under 35 U.S.C. 154(b) by 193 days.

(21) Appl. No.: 10/341,731

(22) Filed: Jan. 14, 2003

(65) Prior Publication Data

US 2004/0136412 A1 Jul. 15, 2004

(51) Int. Cl.[7] .......................... H01S 3/083; H01S 3/08
(52) U.S. Cl. .......................... 372/94; 372/102
(58) Field of Search .......................... 372/92–102, 20

(56) References Cited

U.S. PATENT DOCUMENTS

| | | | | | |
|---|---|---|---|---|---|
| 4,924,476 | A | * | 5/1990 | Behfar-Rad et al. | 372/94 |
| 5,140,599 | A | * | 8/1992 | Trutna et al. | 372/20 |
| 5,231,642 | A | * | 7/1993 | Scifres et al. | 372/45 |
| 5,243,609 | A | * | 9/1993 | Huber | 372/19 |
| 5,398,256 | A | * | 3/1995 | Hohimer et al. | 372/94 |
| 5,438,639 | A | * | 8/1995 | Ford et al. | 385/30 |
| 5,825,799 | A | * | 10/1998 | Ho et al. | 372/92 |
| 5,854,870 | A | * | 12/1998 | Helmfrid et al. | 385/122 |
| 5,946,129 | A | * | 8/1999 | Xu et al. | 359/332 |
| 6,272,165 | B1 | * | 8/2001 | Stepanov et al. | 372/94 |
| 6,668,006 | B1 | * | 12/2003 | Margalit et al. | 372/97 |
| 2002/0105998 | A1 | * | 8/2002 | Ksendzov | 372/92 |
| 2003/0219045 | A1 | * | 11/2003 | Orenstein et al. | 372/20 |

OTHER PUBLICATIONS

G. Griffel. "Vernier Effect In Asymmetrical Ring Resonator Arrays." IEEE Photonics Technology Letters. vol. 12, No. 12, Dec. 2000.

H. Ishii et al. "Broad–Range Wavelength Coverage (62.4nm) With Superstructure–grating DBR Laser." Electronics Letters. vol. 32, No. 5, Feb. 29, 1996.

B. Liu et al. "Wide Tunable Double Ring Resonator Coupled Lasers." IEEE Photonics Technology Letters, vol. 14, No. 5, May 2002.

J. Mellis et al. "Miniature Packaged External–Cavity Semiconductor Laser With 50 GHz Continuous Electrical Tuning Range." Electronics Letters. vol. 24, No. 16, Aug. 4, 1988.

G. Morthier et al. "A λ/4–Shifted Sampled Or Superstructure Grating Widely Tunable Twin–Guide Laser." IEEE Photonics Technology Letters. vol. 13, No. 10, Oct. 2001.

Y. Tohmori et al. "Broad–Range Wavelength–Tunable Superstructure Grating (SSG) DBR Lasers." IEEE Journal of Quantum Electronics. vol. 29, No. 6, Jun. 1993.

V. Van et al. "Propagation Loss In Single–Mode GaAs–AlGaAs Microring Resonators: Measurement and Model." Journal of Lightwave Technology. vol. 19, No. 11, Nov. 2001.

* cited by examiner

*Primary Examiner*—Minsun Oh Harvey
*Assistant Examiner*—Phillip Nguyen
(74) *Attorney, Agent, or Firm*—Hanley, Flight & Zimmerman, LLC

(57) ABSTRACT

External cavity, widely tunable lasers and methods of tuning the same are disclosed. One such example laser includes a semiconductor laser, a ring resonator coupled to the semiconductor laser; and a Bragg grating. The Bragg grating is coupled to the ring resonator to reflect a portion of light output by the ring resonator back to the semiconductor laser to select a lasing frequency of the semiconductor laser.

14 Claims, 4 Drawing Sheets

EXTERNAL CAVITY, WIDELY TUNABLE LASERS AND METHODS OF TUNING THE SAME

FIELD OF THE DISCLOSURE

This disclosure relates generally to lasers and, more particularly, to external cavity, widely tunable lasers and methods of tuning the same.

BACKGROUND

Optical networks frequently use fixed wavelength laser sources. However, widely tunable lasers are advantageous over fixed lasers in this context. For example, an eighty channel network with five regeneration points requires almost five hundred fixed wavelength lasers. Each of these fixed wavelength lasers requires a backup, which means there are approximately five hundred backup network cards sitting idle in inventory at a given time. Since each of these cards can cost between $10,000 and $50,000, this is an expensive proposition. If widely tunable lasers are used in place of the fixed lasers, the number of backup cards required by this network is reduced by at least the channel count, which results in a substantial cost savings.

In addition to these financial savings, employing widely tunable lasers instead of fixed lasers has other advantages. For example, tunable sources permit flexible, more responsive provisioning of bandwidth, thereby simplifying network planning and expansion of the network as a whole. Widely tunable sources also enable the network provider to dynamically or statically assign consumers their own wavelength channel(s). Moreover, tunable light sources can be used in optical networks to perform routing on a wavelength basis.

A prior art tunable laser 10 is shown in FIG. 1. This conventional external cavity laser 10 includes a semiconductor laser 12 and two Bragg gratings 14. Each of the Bragg gratings 14 is coupled to an end of the laser 12 via a passive waveguide 16. Each of the gratings 14 functions as an end mirror, and at least one of the gratings 14 (e.g., the grating 14 at the left side of FIG. 1) reflects some light and passes some light to provide the laser output.

Example reflection spectra for the Bragg gratings 14 are shown in FIG. 2. Each of the illustrated reflection spectra includes a set of high reflectivity peaks. Since, as shown in FIG. 2, each of the Bragg gratings 14 has a different period, the positions of the peaks associated with the gratings 14 are largely out of alignment. However, one pair of the peaks is in alignment (e.g., the peaks at approximately 1.31 $\mu$m (micro meters)). This overlap determines the lasing wavelength since light is being coherently reflected back and forth through the gain chip 12 at this wavelength. Changing the index of refraction of either of the gratings 14 will cause the reflection peaks associated with that grating to shift. Therefore, changing the index of refraction of one or both of the gratings 14 will cause the lasing wavelength to hop from one successive peak of the reflection spectrum of the other grating 14 to the next (see FIG. 3 where the lasing wavelength has shifted to about 1.328 $\mu$m).

Significantly, as can be seen by comparing FIGS. 2 and 3, a relatively small shift in the reflection spectrum of one of the gratings 14 results in a relatively large shift in the lasing wavelength due to the vernier-like effect between the spectra of the gratings 14. Thus, changing the index of refraction of one or both of the gratings 14 permits tuning of the laser over a wide range of wavelengths.

Tuning of the laser can be achieved by adjusting the index of refraction of one grating or by adjusting the indices of refraction of both gratings 14 simultaneously. Optionally, the laser may incorporate a phase section to achieve substantially continuous tuning without hoping between cavity modes.

One disadvantage of leveraging the vernier-like effect of two Bragg gratings is the packaging difficulty. In particular, each of the Bragg gratings 14 must be coupled to an end of the laser gain chip 12 as shown in FIG. 1. Additional packaging is then needed to couple the final laser 10 to an output fiber (not shown).

Tunable laser sources have also been produced by coupling an anti-reflection (AR) coated Fabry-Perot laser diode to an external cavity. The laser diode provides the gain. The external cavity provides wavelength tuning. The wavelength selective external cavity may include gratings, etalons or arrayed waveguides (AWG's) in order to achieve tuning.

DETAILED DESCRIPTION

Figure 4:
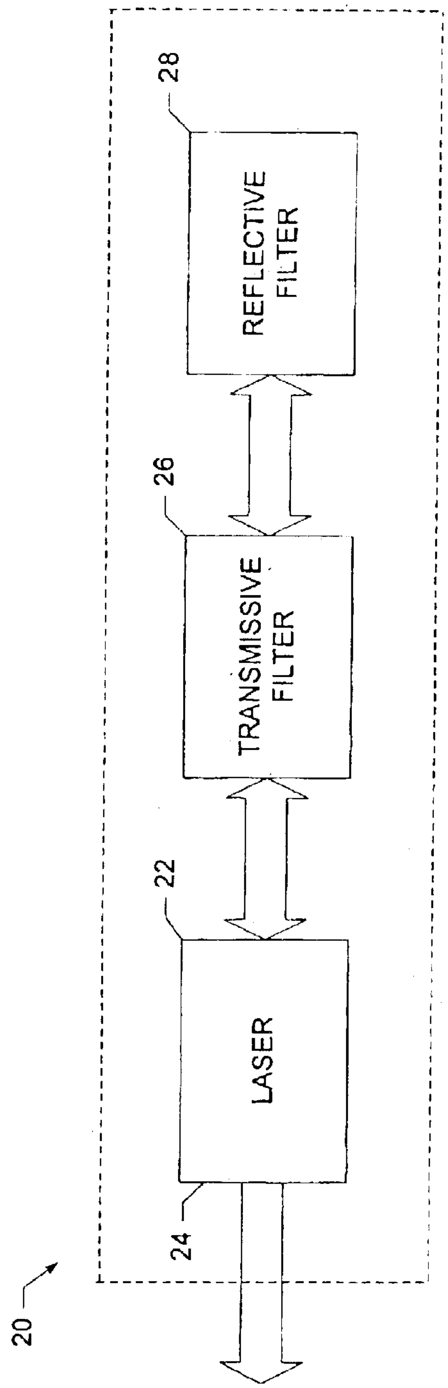
FIG. 4 is a schematic illustration of an example external cavity, widely tunable laser constructed in accordance with the teachings of the invention.
Figure 2:
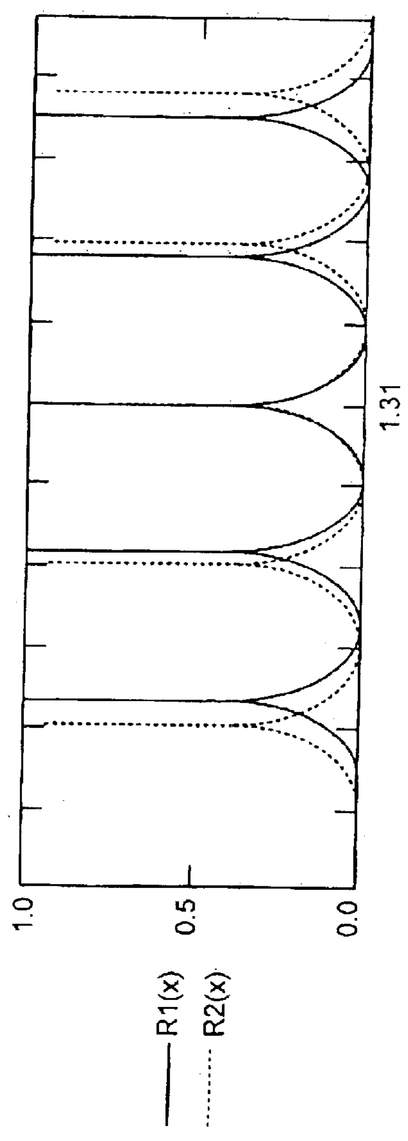
FIG. 2 illustrates the reflection spectra from the Bragg gratings of the laser of FIG. 1.
Figure 3:
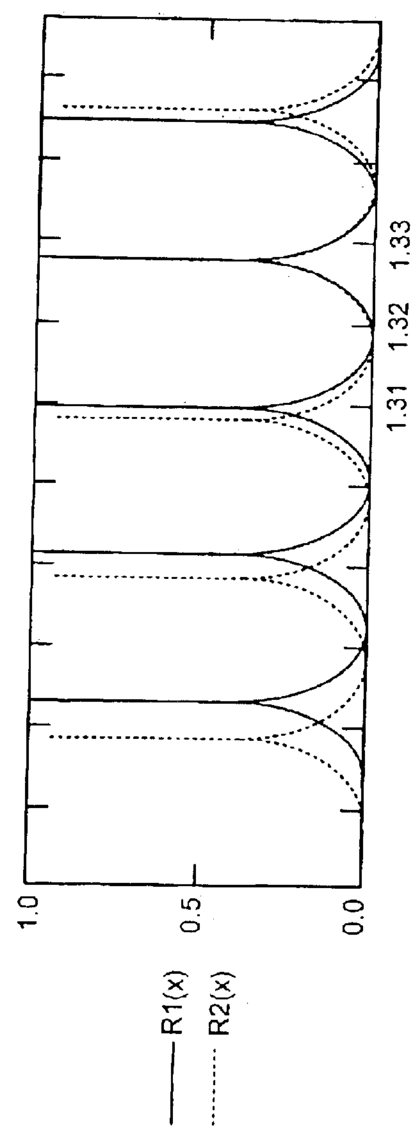
FIG. 3 is similar to FIG. 2, but illustrating the reflection spectra after tuning one or both of the gratings of FIG. 1.

FIG. 4 is a schematic illustration of an example external cavity, widely tunable laser 20. In this example, the laser 20 includes a semiconductor laser diode 22. The laser chip 22 provides the gain for the laser 20 in a conventional fashion. The laser diode 22 may be implemented, for example, by a Fabry-Perot laser. A first end of the laser 22 includes a mirror 24. The mirror 24 is adapted to reflect a percentage of the light that engages its surface and to pass a percentage of that same light. The mirror may be implemented, for example, by cleaving an end of the laser 22 in a known manner.

For the purpose of selecting a lasing wavelength, the laser 20 is further provided with an external tuning cavity. In the example of FIG. 4, the external tuning cavity includes a transmissive filter 26 and a reflective filter 28. The transmissive filter 26 is positioned to receive light reflected from the mirror 24. The transmissive filter 26 acts upon the light it receives from the laser 22 to output filtered light having a transmission spectrum including a set of transmission peaks.

The reflective filter 28 is positioned to receive the filtered light from the transmissive filter 26 as shown in FIG. 4. The reflective filter 28 has an associated reflective spectrum including a set of reflection peaks. The transmissive filter 26 and the reflective filter 28 are selected such that the period of the transmission spectrum is different from the period of the reflective spectrum. As a result, in this example, only one transmission peak and one reflection peak overlap within the operating range of the laser chip 22. The reflective filter 28 reflects light having a wavelength corresponding to the overlapping transmission and reflection peaks back to the laser chip 22 via the transmissive filter 26. The wavelength of the reflected light is the wavelength of the overlapping peaks. It is also the lasing wavelength for the laser 20.

If the index of refraction of the transmissive filter 26 is adjusted, the peaks of the transmission spectrum will shift slightly. Similarly, if the index of refraction of the reflective filter 28 is adjusted, the peaks of the reflective spectrum will slightly shift. Therefore, if the index of refraction of one or both of the transmissive and reflective filters 26, 28 are changed, the vernier-like effect between the transmission and reflective spectra will result in a different pair of overlapping peaks and, thus, selection of a different lasing wavelength for the laser 20. In other words, adjusting the index of refraction of one or both of the transmissive and reflective filters 26, 28 adjusts the wavelength of the light reflected by the reflective filter 28 to thereby tune the wavelength of the light output by the laser 20.

Figure 1:
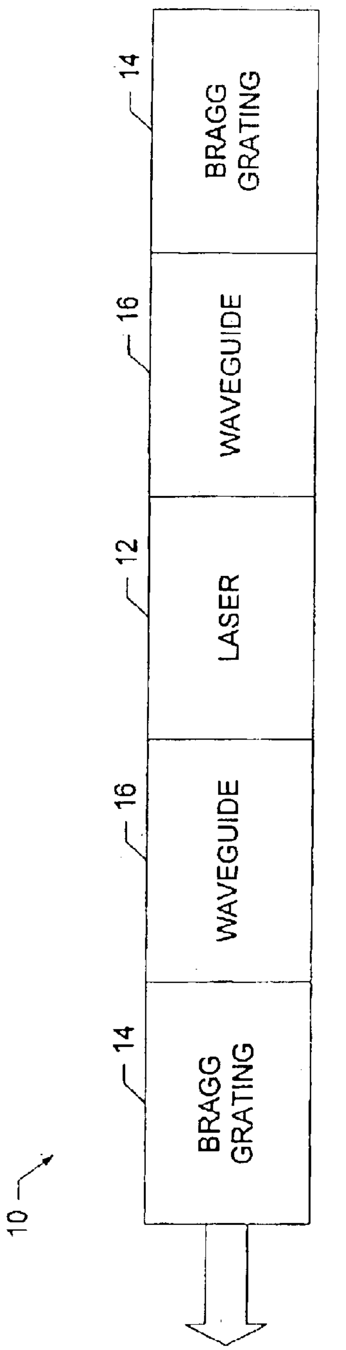
FIG. 1 is a schematic illustration of a prior art external cavity, widely tunable laser.

The example laser 20 of FIG. 4 is advantageous over the prior art laser 10 of FIG. 1 in that the laser 20 does not require gratings at each end of the laser chip 22. Instead, an external tuning cavity is coupled to one end of the laser chip 22. This approach simplifies packaging while still achieving a wide tuning range.

Figure 5:
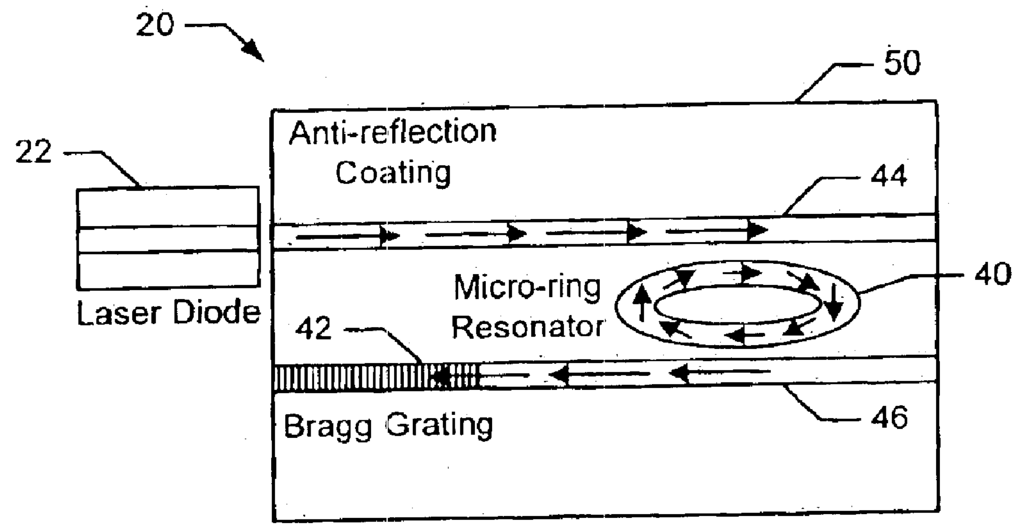
FIG. 5 illustrates an example implementation of the laser of FIG. 4.

An example manner of implementing the tunable laser 20 of FIG. 4 is shown in FIG. 5. In the example of FIG. 5, the laser chip 22 is implemented by an anti-reflection coated Fabry-Perot laser having a cleaved end that functions as a mirror, the transmissive filter 26 is implemented by a ring resonator 40, and the reflective filter 28 is implemented by a Bragg grating 42. As shown in FIG. 5, the ring resonator 40 is coupled to the semiconductor laser chip 22 via a waveguide 44. The light output by the laser chip 22 passes through the waveguide 44 and is input to a first side of the ring resonator 40 via evanescent coupling.

Figure 6:
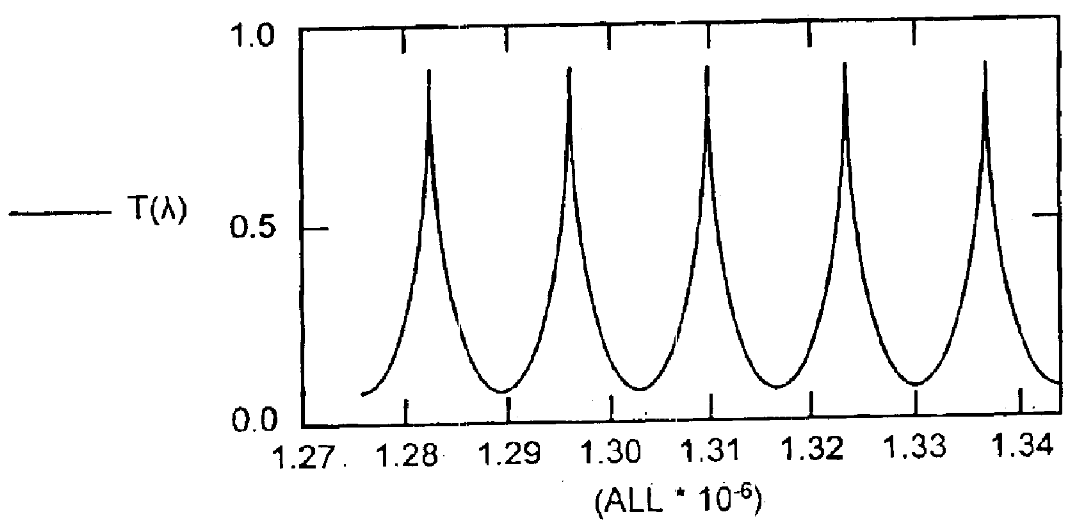
FIG. 6 illustrates a transmission spectrum of an example ring resonator.

The transmission spectrum of a ring resonator includes a series of peaks separated by a free spectral range of $(\Delta v)=c/2\pi nR$, where c is the speed of light in a vacuum, n is the effective index of the ring resonator 40, and r is the radius of that ring resonator 40. In other words, there is a spacing of $(\Delta\lambda)=\lambda^2/2\pi nR$ between the transmission maxima in the wavelength transmission spectrum of the ring resonator 40. A laser working at 1310 nm (nanometers) in a course wavelength division multiplexing (CWDM) system requires a channel spacing of 13 nm. Thus, if it is assumed that the tuning element is made of 2.5 μm thick silicon on insulator (SOI), with 2.5 μm wide waveguides having an effective index of refraction of 3.455, solving the above equation reveals that the ring resonator 40 should have a radius of 6.08 μm to yield 13 nm channel spacing. The transmission spectrum of such an example ring resonator 40 is shown in FIG. 6.

As shown in FIG. 5, the light passing through the ring resonator 44 is output via evanescent coupling through a second side of the ring 44 to a second waveguide 46. The waveguide 46 delivers the light received from the ring resonator 40 to the Bragg grating 42. The Bragg grating 42 functions to reflect a portion of the light output by the ring resonator 40 back to the laser chip 22 to select a lasing frequency of the laser 20.

The reflection spectrum of the Bragg grating 42 has a free spectral range that is different from the free spectral range of the ring resonator 40. For instance in the above example the free spectral range of the ring 40 was 13 nm. In such an example, the free spectral range of the Bragg grating 42 may be, for example, 11 nm.

Such a free spectral range may be obtained, for example, by using either a superstructure grating or a sampled grating. For instance, the Bragg grating 42 may have a long range modulation added to it that causes side bands to appear in its reflection spectrum. In the SOI example given above, with an index of refraction of 3.455, a grating 42 with a period of 4.73 μm will result in a $25^{th}$ order Bragg reflection at 1310 nm. If the grating is patterned with an amplitude mask having a period of 45 μm, the spectrum of the grating 42 will have reflection peaks on either side of the main Bragg wavelength separated by 11 nm as shown by $R_{grating}$ in FIG. 7. The positions of reflection maxima of a super structured grating is given by $2\pi n/\lambda=m\pi/\Lambda+2\pi n/L_{ss}$, where λ is the wavelength of the reflection maxima of the grating period given by Λ, and $L_{ss}$ is the period of the superstructure patterned on the grating. N and m are integers. Persons of ordinary skill in the art will readily appreciate that the desired side bands may also be obtained using phase modulation instead of amplitude modulation of the Bragg grating 42.

Figure 7:
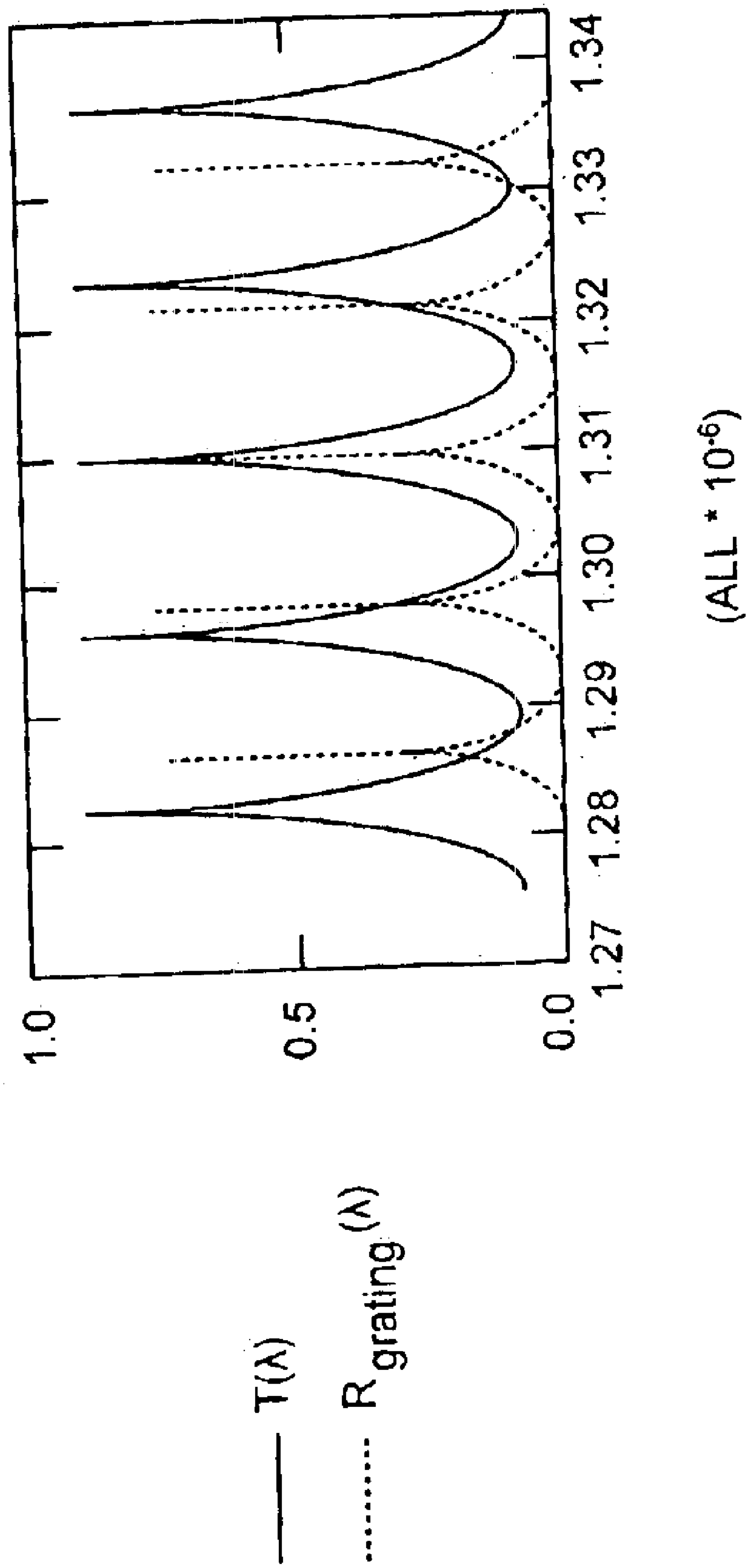
FIG. 7 illustrates the transmission spectrum of FIG. 6 juxtaposed with a reflection spectrum of an example Bragg grating.

As shown in FIG. 7, the transmission spectrum of the ring resonator 40 and the reflective spectrum of the Bragg grating 42 act as a kind of vernier. The Bragg grating 42 only reflects light having a wavelength corresponding to one of the transmission peaks received from the ring resonator 42. This reflected light is fed back into the gain chip 22, is the only wavelength of light that experiences stimulated emission, and, thus, is the wavelength that lases. By changing the refractive index of the Bragg grating 42, the ring resonator 40, or both the grating 42 and resonator 40, the wavelength at which the transmission peaks and the reflective peaks coincide can be shifted to thereby tune the laser 20 from one CWDM communication channel to another.

In the example of FIG. 5, the Bragg grating 42, the ring resonator 40 and the waveguides 44, 46 are formed in a single substrate 50. The substrate 50 may be constructed of any suitable material such as, for example, silicon. If silicon is used as the substrate 50 for the resonator 40 and the grating 42, tuning of the refractive index can be achieved by heating the substrate (i.e., utilizing the thermo-optic effect), and/or by modulating the number of free carriers (i.e., carrier injection). In the former case, either the entire substrate 50 may be heated to effect the indices of refraction of both the ring resonator 40 and the Bragg grating 42, or localized heating may be employed to adjust the index of refraction of one of the resonator 40 and the grating 42 more heavily than the index of refraction of the other of the resonator 40 and the grating 42. In the latter case (i.e., carrier injection), a conventional control circuit (not shown) such as a programmable processor driving a conventional current source may be coupled to the ring resonator 40 and/or the Bragg grating 42 to apply a controlled current to the device(s) to thereby change the effective optical path length through the affected filter 26, 28.

Simultaneously tuning both the Bragg grating 42 and the ring resonator 40 enables quasi-continuous tuning (i.e., within mode hoping between the cavity modes). A conventional phase section (not shown) may be added between the laser diode 22 and the ring resonator 40 to permit continuous tuning. Such a phase section may be used to selectively change the phase of the output of the laser 20 in a known fashion within small increments between the larger scale adjustments produced by adusting the index of refraction of one or both of the filters 26, 28.

From the foregoing, persons of ordinary skill in the art will readily appreciate that a method of tuning a laser has been disclosed. In an example method, a first light signal is developed. The first light signal is then processed with a first device to generate a second light signal having a first spectral range. The second light signal is then reflected with a second device having a second spectral range different from the first spectral range to cause stimulated emission at a selected wavelength. Changing one or more properties associated with one or both of the first and second devices changes the wavelength selected for the laser.

The first light signal may be developed with a semiconductor laser 22. Processing the first light may comprise passing the light through a ring resonator 40. Reflecting the second light may comprise reflecting the second light signal with a Bragg grating.

Although certain example methods and apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. A tunable laser comprising;

a semiconductor laser located on a first substrate;

a ring resonator coupled to the semiconductor laser;

a Bragg grating coupled to the ring resonator to reflect a portion of light output by the ring resonator bark to the semiconductor laser to select a lasing frequency of the semiconductor laser, and a phase changing device to selectively change a phase of an output of the semiconductor laser, wherein the ring resonator, the Bragg grating, and the phase changing device are located on a second substrate separate from the first substrate.

2. A tunable laser as defined in claim 1 wherein the semiconductor laser includes a mirror to partially reflect light and partially pass light.

3. A tunable laser as defined in claim 2 wherein the mirror comprises a cleaved end of the semiconductor laser.

4. A tunable laser as defined in claim 1 wherein the light output by the ring resonator has a free spectral range substantially equal to c/2 πnR, where c is a speed of light in a vacuum, n is an effective index of the ring resonator, and R is a radius of the ring resonator.

5. A tunable laser as defined in claim 1 wherein the Bragg grating comprises at least one of a superstructure grating and a sampled grating.

6. A tunable laser as defined in claim 1 wherein the Bragg grating is patterned with an amplitude mask.

7. A tunable laser as defined in claim 1 wherein the Bragg grating is phase modulated.

8. A tunable laser as defined in claim 1, wherein heating the substrate tunes at least one of a refractive index of the ring resonator and a refractive index of the Bragg grating.

9. A tunable laser as defined in claim 1 wherein the second substrate is silicon.

10. A tunable laser as defined in claim 1 further comprising a control circuit to modulate a number of free carriers to tune at least one of a refractive index of the ring resonator and a refractive index of the Bragg grating.

11. A tunable laser as defined in claim 1 wherein the semiconductor laser is a Fabry-Perot laser.

12. A tunable laser as defined in claim 11 wherein the Fabry-Perot laser is anti-reflection coated.

13. A tunable laser as defined in claim 1 wherein adjusting at least one of an index of refraction of the ring resonator and an index of refraction of the Bragg grating, adjusts the lasing frequency of the tunable laser.

14. A tunable laser as defined in claim 1 wherein the phase changing device is located between the semiconductor laser and the ring resonator.

* * * * *